(12) United States Patent
Wang

(10) Patent No.: US 10,872,767 B2
(45) Date of Patent: Dec. 22, 2020

(54) LASER ANNEALING APPARATUS, AND FABRICATION METHODS OF POLYCRYSTALLINE SILICON THIN FILM AND THIN FILM TRANSISTOR

(71) Applicants: BOE TECHNOLOGY GROUP CO., LTD., Beijing (CN); ORDOS YUANSHENG OPTOELECTRONICS CO., LTD., Inner Mongolia (CN)

(72) Inventor: Jingshuai Wang, Beijing (CN)

(73) Assignees: BOE TECHNOLOGY GROUP CO., LTD., Beijing (CN); ORDOS YUANSHENG OPTOELECETRONICS CO., LTD., Ordos (CN)

(*) Notice: Subject to any disclaimer, the term of this patent is extended or adjusted under 35 U.S.C. 154(b) by 0 days.

(21) Appl. No.: 15/696,814

(22) Filed: Sep. 6, 2017

(65) Prior Publication Data
US 2018/0151360 A1 May 31, 2018

(30) Foreign Application Priority Data
Nov. 29, 2016 (CN) .......................... 2016 1 1072259

(51) Int. Cl.
*H01L 21/02* (2006.01)
*B23K 26/12* (2014.01)
(Continued)

(52) U.S. Cl.
CPC .... *H01L 21/02678* (2013.01); *B23K 26/0626* (2013.01); *B23K 26/0665* (2013.01);
(Continued)

(58) Field of Classification Search
CPC ............ B23K 26/0626; B23K 26/0673; H01L 21/02678; H01L 21/02691; H01L 21/02686
See application file for complete search history.

(56) References Cited

U.S. PATENT DOCUMENTS 5,795,795 A 8/1998 Kousai et al.
6,815,377 B2 * 11/2004 Mitsuhashi .......... B23K 26/032
438/795
(Continued)

FOREIGN PATENT DOCUMENTS

CN 1599040 A 3/2005
CN 1753155 A 3/2006
(Continued)

OTHER PUBLICATIONS

The First Chinese Office Action dated Dec. 5, 2018; Appln. No. 201611072259.2.

*Primary Examiner* — Tu B Hoang
*Assistant Examiner* — Vy T Nguyen

(57) ABSTRACT

A laser annealing apparatus, a fabrication method of a polysilicon thin film, and a fabrication method of a thin film transistor are provided. The laser annealing apparatus includes: a laser generator, an optical system and an annealing chamber. The laser generator is configured to emit a laser beam, and the laser beam is guided to the annealing chamber via the optical system. The optical system includes a beam splitter, the beam splitter decomposes the laser beam into a first beam and a second beam, an energy density of the first beam is greater than an energy density of the second beam, and the first beam and the second beam are guided into the annealing chamber for laser annealing.

11 Claims, 4 Drawing Sheets

(51) Int. Cl.
  *G02B 19/00*  (2006.01)
  *H01L 27/12*  (2006.01)
  *B23K 26/06*  (2014.01)
  *B23K 26/067*  (2006.01)
  *G02B 27/14*  (2006.01)
  *H01L 21/67*  (2006.01)
  *H01L 29/66*  (2006.01)
  *H01S 3/225*  (2006.01)

(52) U.S. Cl.
  CPC ........ *B23K 26/0673* (2013.01); *B23K 26/127* (2013.01); *B23K 26/128* (2013.01); *G02B 19/0019* (2013.01); *G02B 19/0023* (2013.01); *G02B 19/0047* (2013.01); *G02B 27/14* (2013.01); *H01L 21/0262* (2013.01); *H01L 21/02532* (2013.01); *H01L 21/02592* (2013.01); *H01L 21/02595* (2013.01); *H01L 21/02686* (2013.01); *H01L 21/02691* (2013.01); *H01L 21/67115* (2013.01); *H01L 27/1285* (2013.01); *H01L 27/1296* (2013.01); *H01L 29/66757* (2013.01); *H01L 29/66765* (2013.01); *H01S 3/225* (2013.01)

(56) References Cited

U.S. PATENT DOCUMENTS

| | | | | |
|---|---|---|---|---|
| 2001/0009251 | A1* | 7/2001 | Sekizawa | B23K 26/0604 219/121.73 |
| 2003/0057418 | A1 | 3/2003 | Asano | |
| 2003/0203656 | A1* | 10/2003 | Kasahara | H01L 21/2026 438/795 |
| 2005/0035103 | A1* | 2/2005 | Partlo | B23K 26/0732 219/121.73 |
| 2005/0170569 | A1* | 8/2005 | Yazaki | B23K 26/702 438/155 |
| 2006/0228908 | A1* | 10/2006 | Chung | H01L 21/2026 438/795 |
| 2007/0096008 | A1* | 5/2007 | Akins | B23K 26/0604 250/201.1 |
| 2009/0032511 | A1* | 2/2009 | Adams | B23K 26/0613 219/121.75 |
| 2010/0279439 | A1* | 11/2010 | Shah | H01L 21/67155 438/15 |
| 2011/0008973 | A1* | 1/2011 | Kawaguchi | B23K 26/0608 438/795 |
| 2011/0086441 | A1* | 4/2011 | Kawaguchi | B23K 26/046 438/7 |
| 2011/0228537 | A1* | 9/2011 | Yoshimizu | G02B 27/0955 362/268 |
| 2013/0161312 | A1* | 6/2013 | Im | H01L 21/268 219/385 |
| 2014/0027417 | A1* | 1/2014 | Simon | B23K 26/0081 219/121.65 |
| 2017/0057019 | A1* | 3/2017 | Lee | B23K 26/127 |

FOREIGN PATENT DOCUMENTS

| | | |
|---|---|---|
| JP | 08148428 A | 6/1996 |
| KR | 1020050076826 A | 7/2005 |

* cited by examiner

LASER ANNEALING APPARATUS, AND FABRICATION METHODS OF POLYCRYSTALLINE SILICON THIN FILM AND THIN FILM TRANSISTOR

The present application claims priority of Chinese Patent Application No. 201611072259.2 filed on Nov. 29, 2016, the present disclosure of which is incorporated herein by reference in its entirety as part of the present application.

TECHNICAL FIELD

Embodiments of the present disclosure relate to a laser annealing apparatus, a fabrication method of a polysilicon thin film, and a fabrication method of a thin film transistor.

BACKGROUND

Liquid crystal display (LCD) includes a switching element, and the switching element for example is an amorphous silicon thin film transistor (a-Si TFT) or a polysilicon thin film transistor (Poly-Si TFT). The LCD having the Poly-Si TFT has a faster operation speed than the LCD having the a-Si TFT, and the Poly-Si TFT has advantages of low power consumption, high electron mobility and so on, so that the LCD having the Poly-Si TFT provides image display quality better than that of the LCD having the a-Si TFT.

In early days, a temperature in an fabrication process of the polysilicon thin film transistor is as high as 1000° C., so that selection of a material for forming a substrate of the polysilicon thin film transistor has been greatly limited. In recent years, with development of a laser technology, the temperature in the fabrication process of the polysilicon thin film transistor is reduced below 600° C., and the polysilicon thin film transistor obtained by using such fabrication process is also referred to as a low temperature polysilicon TFT (LTPS TFT).

The key step of fabricating the LTPS TFT is converting amorphous silicon to polysilicon. Methods for converting amorphous silicon to polysilicon may be divided into two types: non-laser crystallization and laser annealing. Among the non-laser crystallization methods, a simplest method is solid phase crystallization (SPC); however, the SPC needs annealing for 10 hours under a condition of 600° C., which is not applicable to a glass substrate of a large area. Among the laser annealing methods, a most widely used one is excimer laser annealing (ELA), and the polysilicon formed by using the ELA method has high crystallinity, high crystallization speed and high mobility. Besides, the ELA is suitable for mass production.

SUMMARY

According to embodiments of the disclosure, a laser annealing apparatus is provided. The laser annealing apparatus comprises: a laser generator, an optical system and an annealing chamber. The laser generator is configured to emit a laser beam, the laser beam is guided to the annealing chamber via the optical system; the optical system includes a beam splitter, the beam splitter decomposes the laser beam into a first beam and a second beam, an energy density of the first beam is greater than an energy density of the second beam, and the first beam and the second beam are guided into the annealing chamber for laser annealing.

For example, an energy of the first beam is greater than an energy of the second beam.

For example, the laser generator is an excimer laser.

For example, the excimer laser includes an inert gas excimer laser, an inert gas halide excimer laser, a mercury halide excimer laser, an inert gas oxide excimer laser and a polyatomic excimer laser.

For example, the optical system further includes a light uniformization component, a focus mirror and a reflection mirror.

For example, the light uniformization component includes a short axis light uniformization element, a collection element, a long axis light uniformization element, a long axis expansion element and a short axis contraction element, and in a propagation direction of the laser beam, the short axis light uniformization element, the collection element, the long axis light uniformization element, the long axis expansion element, and the short axis contraction element are sequentially arranged in this order.

For example, the focus mirror includes a long axis focus mirror, a short axis focus mirror, and an auxiliary focus mirror; in the propagation direction of the laser beam, the long axis focus mirror is located between the long axis light uniformization element and the long axis expansion element; in the propagation direction of the laser beam, the short axis focus mirror is located between the short axis contraction element and the beam splitter; and in the propagation direction of the laser beam, the auxiliary focus mirror is located behind the beam splitter and the reflection mirror.

For example, the reflection mirror includes a first reflection mirror, a second reflection mirror and a third reflection mirror; the first beam is reflected by the first reflection mirror and the second reflection mirror and then is guided to the annealing chamber; and the second beam is reflected by the third reflection mirror and then is guided to the annealing chamber.

For example, the laser annealing apparatus comprises at least two laser generators respectively emitting a first laser beam and a second laser beam, the first laser beam and the second laser beam being combined to obtain the laser beam.

For example, an energy of the first laser beam and an energy of the second laser beam are both 1000 mj, an energy of the first beam is 1200 mj, and an energy of the second beam is 800 mj.

For example, the laser annealing apparatus further comprises a carrier provided in the annealing chamber for carrying a substrate, and a first detector and a second detector respectively provided on both ends of the carrier. The first detector and the second detector respectively detect the energy density of the first beam and the energy density of the second beam.

For example, the annealing chamber is filled with a protective gas.

For example, the laser annealing apparatus further comprises a first attenuator and a second attenuator. The first attenuator and the second attenuator respectively attenuate the energy density of the first beam and the energy density of the second beam.

According to the embodiments of the disclosure, a fabrication method of a polysilicon thin film is provided. The method comprises: providing a substrate; forming an amorphous silicon thin film on the substrate; emitting a laser beam; decomposing the laser beam into a first beam having a first energy density and a second beam having a second energy density, the first energy density being greater than the second energy density. The first beam firstly irradiates the amorphous silicon thin film to anneal the amorphous silicon thin film to the polysilicon thin film, and then the second beam irradiates a surface of the polysilicon thin film to reduce non-uniformity of the surface of the polysilicon thin film.

For example, the second beam irradiates the surface of the polysilicon thin film so that the surface of the polysilicon thin film is just melted.

For example, before irradiating the amorphous silicon thin film with the first beam, a high-temperature process is performed on the amorphous silicon thin film.

According to the embodiments of the disclosure, a fabrication method of a thin film transistor is provided. The method comprises: preparing a polysilicon thin film by using the fabrication method as described above; and patterning the polysilicon thin film to form a polysilicon pattern serving as an active layer of the thin film transistor.

For example, the fabrication method further comprises: forming a first insulation layer, a gate electrode and a second insulation layer on the polysilicon pattern; partially etching the first insulation layer and the second insulation layer to form a first contact hole and a second contact hole; and forming a source electrode and a drain electrode on the second insulation layer, wherein, the source electrode and the drain electrode are electrically connected with the polysilicon pattern through the first contact hole and the second contact hole, respectively.

For example, the fabrication method further comprises: forming a gate electrode and a first insulation layer on the substrate before the forming the polysilicon pattern; forming a source electrode and a drain electrode on the polysilicon pattern after the forming the polysilicon pattern.

According to the embodiments of the disclosure, a laser annealing apparatus is provided. The laser annealing apparatus comprises: a laser generator, an optical system and an annealing chamber. The laser generator is configured to emit a laser beam, the laser beam is guided to the annealing chamber via the optical system; the optical system includes a beam splitter, the beam splitter decomposes the laser beam into a first beam and a second beam, an energy of the first beam is greater than an energy of the second beam, and the first beam and the second beam are guided into the annealing chamber for laser annealing.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
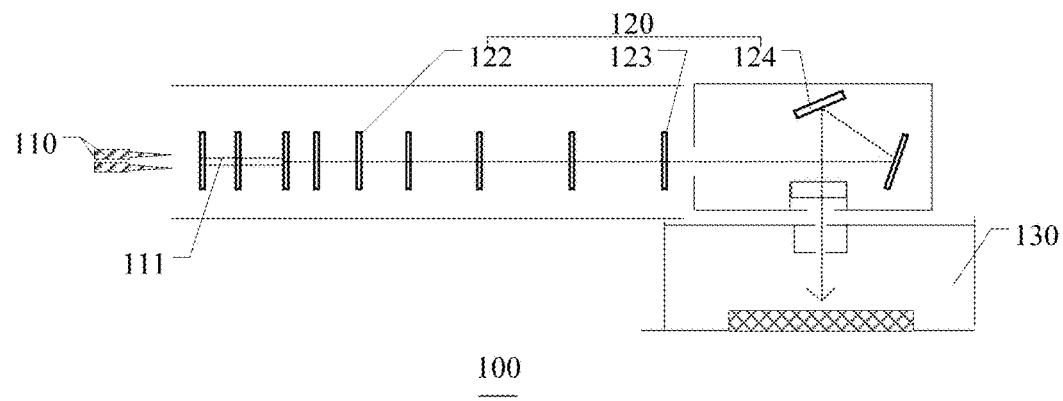
FIG. 1 is a structural schematic view of a laser annealing apparatus according to one technique.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "connect" or "interconnect" and the like are not limited to physical or mechanical connections, but may include electrical connections, whether direct or indirect. Expressions such as "up", "down", "left", "right" and the like are only used for expressing relative positional relationship, the relative positional relationship may be correspondingly changed in the case that the absolute position of a described object is changed.

In a fabrication method of a polysilicon thin film, an amorphous silicon thin film for example is converted to a polysilicon thin film by using an excimer laser annealing (ELA) process. After annealing is performed on the amorphous silicon thin film with a laser annealing apparatus to convert the amorphous silicon thin film into the polysilicon thin film, a number of protrusions are formed on a surface of the polysilicon thin film. Reasons why these protrusions are formed include that: in a process of conversion from amorphous silicon to polysilicon, a crystal grain grows transversely from a crystal nucleus; since density of solid amorphous silicon is relatively small (about 2.32 g/cm$^3$), and when amorphous silicon is melted, an excess volume is squeezed to a region which has not yet been cured. When a polysilicon curing process is completed, adjacent two crystal grains are squeezed together to form a grain boundary, the grain boundary is at a position where p-Si is finally cured in the crystallization process, and the excess volume accumulates at the grain boundary to form the protrusions; these protrusions at the grain boundary lead to larger roughness of a surface of the formed polysilicon thin film, and the roughness of the surface of the polysilicon thin film is proportional to a leakage current of the thin film transistor using the polysilicon thin film as an active layer in a turning-on state, that is, a size of these protrusions located on the surface of the polysilicon thin film will affect a current characteristic of the low temperature polysilicon thin film transistor (LTPS TFT), so as to cause problems that the LTPS TFT has relatively large leakage current and a non-uniform threshold voltage. Besides, when the protrusions are too high, for example, when a height of the protrusions is greater than 25% of an average thickness of the polysilicon thin film, problems below are further be caused: (1) in a subsequent dry etching process, it is not easy to completely etch away high protrusions by dry etching; (2) it is not conducive to migration of electrons and holes; and (3) it is apt to lead to puncture of a gate insulation layer, which further leads to short circuit occurring between a gate electrode layer and the active layer.

For example, FIG. 1 is a structural schematic view of a laser annealing apparatus, the laser annealing apparatus 100 comprises a laser generator 110, an optical system 120 and an annealing chamber 130, the laser generator 110 is configured to emit a laser beam 111, the optical system 120 includes a light uniformization component 122, a focus mirror 123 and a reflection mirror 124, and the laser beam 111 is guided to the annealing chamber 130 via the optical system 120. The annealing chamber 130 is provided therein with a substrate for laser annealing, and an amorphous silicon thin film is formed on the substrate.

Figure 2:
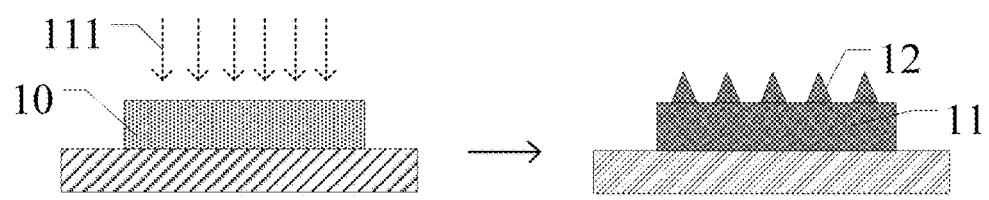
FIG. 2 is a process view of a fabrication method of a polysilicon thin film according to one technique.

For example, FIG. 2 is a process view of a fabrication method of a polysilicon thin film. In the method shown in FIG. 2, the amorphous silicon thin film 10 is annealed with the laser beam 111 from the laser annealing apparatus in FIG. 1, to obtain a polysilicon thin film 11, and the polysilicon thin film 11 has a plurality of first protrusions 12 on its surface. A case where a thickness of the amorphous silicon thin film is 50 nm is provided as an example, the height of the protrusions is obtained by photographing the formed low temperature polysilicon thin film with an atomic force microscope (AFM), and an average height of the protrusions is found to be greater than 13 nm, that is, the average height of the protrusions is greater than 25% of the thickness of the amorphous silicon thin film.

In order to achieve an energy density required in amorphous silicon laser annealing process, the laser annealing apparatus for example combine two laser beams to simultaneously irradiate the amorphous silicon thin film that needs to be annealed. In the case that the rated energy output by a single laser beam is 1000 mj, then total energy of the two laser beams emitted by the laser annealing apparatus reaches 2000 mj. In practice, actually effectively utilized energy during the amorphous silicon thin film is converted to the polysilicon thin film is 60% of the total energy, i.e., 1200 mj. Thus, remaining 40% of the energy of the laser annealing apparatus in FIG. 1 is not effectively utilized, resulting in waste of energy; and, in a subsequent process, the protrusions need to be processed to reduce the height thereof, which renders the process complexity, prolongs a production cycle and increases costs.

An inventor notes the above-described problems in a research, and at a same time, the inventor notes that processing the polysilicon thin film surface with a lower-energy laser may make the surface of the polysilicon thin film just melt, so as to eliminate or reduce the protrusions or reduce the height of the protrusions, so that non-uniformity of the polysilicon thin film surface is reduced, and quality of the thin film transistor obtained thereby is improved. Thus, the inventor implements partially melting of the polysilicon thin film with the remaining 40% of the energy of the laser beam of the laser annealing apparatus; and under a condition that process time is mot changed, the laser beam is decomposed into a first beam and a second beam having different energy densities by a beam splitter, so as to simultaneously complete the process of converting the amorphous silicon thin film to the polysilicon thin film and the process of processing the protrusions on the polysilicon thin film surface, which reduces non-uniformity of the polysilicon thin film surface, and reduces the height of the protrusions to 25% or less of the thickness of the polysilicon thin film.

At least one embodiment of the present disclosure provides a laser annealing apparatus, the laser annealing apparatus for example comprises: a laser generator, an optical system and an annealing chamber, the laser generator is configured to emit a laser beam, the laser beam is guided to the annealing chamber via the optical system, the optical system includes a beam splitter, the beam splitter splits the laser beam into a first beam and a second beam so that an energy density of the first beam is greater than an energy density of the second beam, and the first beam and the second beam are guided into the annealing chamber for laser annealing.

In the case that the laser annealing apparatus provided by the embodiments of the present disclosure is used for annealing the amorphous silicon thin film, the laser beam is decomposed into the first beam having a first energy density and the second beam having a second energy density, the first energy density is greater than the second energy density, and the first beam and the second beam enter the annealing chamber. For example, the first beam firstly irradiates the amorphous silicon thin film to covert the amorphous silicon thin film to the polysilicon thin film, and then the polysilicon thin film is moved so that the second beam irradiates the surface of the polysilicon thin film to reduce the height of the protrusions, so as to reduce non-uniformity of the surface of the polysilicon thin film. For example, the second beam irradiates the surface of the polysilicon thin film so that the surface of the polysilicon thin film is just melted.

Hereinafter, the laser annealing apparatus, the fabrication method of the polysilicon thin film and the fabrication method of the thin film transistor according to the embodiments of the present disclosure will be described in details.

Figure 3:
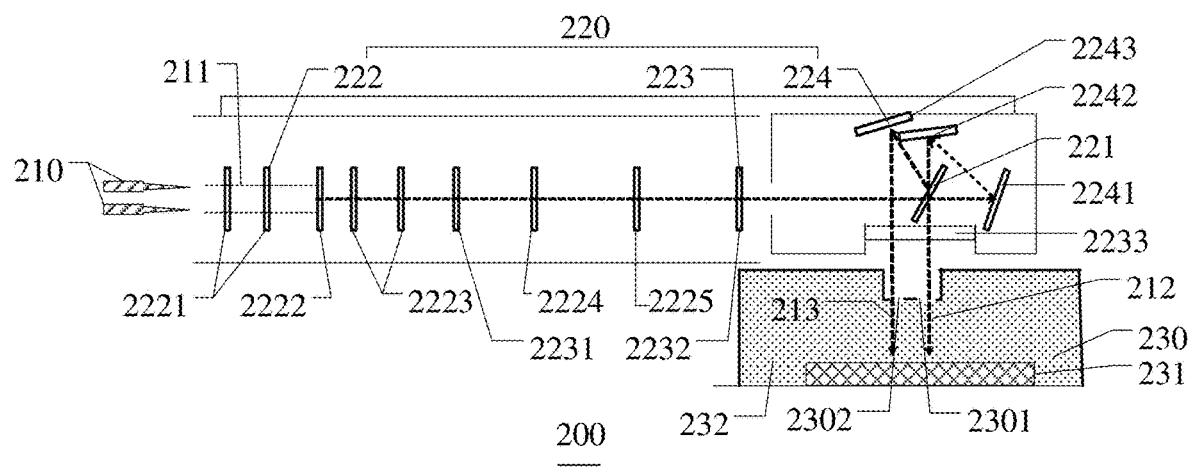
FIG. 3 is a structural schematic view of a laser annealing apparatus provided by embodiments of the present disclosure.

The embodiments of the present disclosure provide the laser annealing apparatus, for example, FIG. 3 is a structural schematic view of the laser annealing apparatus provided by the embodiments of the present disclosure. The laser annealing apparatus 200 comprises: the laser generator 210, the optical system 220 and the annealing chamber 230; the laser generator 210 is configured to emit the laser beam 211, the laser beam 211 is guided to the annealing chamber 230 via the optical system 220; the optical system 220 includes the beam splitter 221, the beam splitter 221 splitting the laser beam 211 into the first beam 212 and the second beam 213, the energy density of the first beam 212 is greater than the energy density of the second beam 213, and the first beam 212 and the second beam 213 are guided into the annealing chamber 230 for laser annealing.

The first beam 212 firstly irradiates the amorphous silicon thin film to convert it to the polysilicon thin film, at this time, the surface of the polysilicon thin film has a plurality of protrusions (i.e., a plurality of small protrusions); then the second beam 213 irradiates the surface of the polysilicon thin film to reduce non-uniformity of the surface of the polysilicon thin film, for example, the second beam 213 irradiates the surface of the polysilicon thin film so that the surface of the polysilicon thin film is just melted, and for example, the surface of the polysilicon thin film is just melted to remove the plurality of protrusions or reduce their heights. In the present disclosure, "the surface of the polysilicon thin film is just melted" refers to that a thickness of a melted portion of the polysilicon thin film does not exceed 25%, preferably no more than 10%, of a total thickness of the polysilicon thin film.

For example, the laser generator is any type of laser, and for example, an excimer laser. The laser generator 210 generates the laser beam 211, and intermittently radiates the laser beam 211 to the annealing chamber 230. The laser generator 210 includes the excimer laser having various characteristics, e.g., a short wavelength, a high output, a high efficiency, and the like.

For example, the excimer laser includes an inert gas excimer laser, an inert gas halide excimer laser, a mercury halide excimer laser, an inert gas oxide excimer laser, and a polyatomic excimer laser.

For example, the inert gas excimer laser includes an $Ar_2$ excimer laser, a $Kr_2$ excimer laser, a $Xe_2$ excimer laser, and the like; the inert gas halide excimer laser includes an ArF excimer laser, an ArCl excimer laser, a KrF excimer laser, a KrCl excimer laser, a XeF excimer laser, a XeCl excimer laser, and the like; the mercury halide excimer laser includes a HgCl excimer laser, a HgBr excimer laser, a HgI excimer laser, and the like; the inert gas oxide excimer laser includes an ArO excimer laser, a KrO excimer laser, a XeO excimer laser, and the like; and the polyatomic excimer laser includes a $Kr_2F$ excimer laser, a $Xe_2F$ excimer laser, and the like.

For example, the laser beam 211 generated by the laser generator 210 has a wavelength in a range of 200 nm to 400 nm. For example, the laser beam 211 generated by the laser generator 210 has the wavelength in a range of 250 nm to 380 nm. For example, the laser beam 211 generated by the laser generator 210 has the wavelength of 308 nm.

For example, the laser beam 211 has a frequency in a range of 300 Hz to 6000 Hz. For example, the laser beam 211 has the frequency in a range of 400 Hz to 4000 Hz. For example, the laser beam 211 generated by the laser generator 210 has the frequency of 500 Hz.

For example, the laser annealing apparatus comprises at least two laser generators, which respectively emit a first laser beam and a second laser beam. For example, maximum energy of each of the first laser beam and the second laser beam is 1000 mj. In the embodiments of the present disclosure, the first laser beam and the second laser beam are combined; and this case, the total energy of the two laser beams for example is 2000 mj.

For example, as shown in FIG. 3, the optical system 220 includes the beam splitter 221, the beam splitter 221 splits the laser beam 211 into the first beam 212 and the second beam 213, such that the energy density of the first beam 212 is greater than the energy density of the second beam 213. For example, the energy density of the first beam 212 is 400 $mj/cm^2$, and the energy density of the second beam 213 is 200 $mj/cm^2$.

For example, the laser annealing apparatus in the embodiments of the disclosure is mainly used in a low temperature polysilicon technology, to convert amorphous silicon to polysilicon. For example, an optimum energy density (OED) for converting the amorphous silicon to the polysilicon is 400 $mj/cm^2$. For example, a shape of a cross section of the laser beam perpendicular to its propagation direction is rectangular, the rectangular cross section of the laser beam has a length of 750 mm, a width of 0.4 mm, and a total area of 300 $mm^2$ (i.e., 3 $cm^2$), in this case, a total energy required to convert amorphous silicon to polysilicon is 1200 mj. For example, the laser annealing apparatus completely converts amorphous silicon having a thickness of 50 nm to polysilicon, the surface of the polysilicon has a plurality of protrusions formed thereon, and an average height of the protrusions is 13 nm. Different energy densities are set to perform a partial melting test (PMT) on the polysilicon surface, and the energy density at which polysilicon surface is just melt is determined by a microscopic picture of the melt polysilicon. It is found that the energy density for just melting the polysilicon surface is 200 $mj/cm^2$, and under a condition that the cross section of the laser beam has the length of 750 mm, the width of 0.4 mm, and the total area of 300 $mm^2$, the energy required for just melting the polysilicon surface is 600 mj. Thus, a sum of the energy (1200 mj) required to convert the amorphous silicon to the polysilicon and the energy (600 mj) for just melting the polysilicon surface is 1800 mj, which is smaller than the total energy of the two laser beams (2000 mj). For example, the energy densities of the first beam 212 and the second beam 213 are controlled by controlling a rotation angle of the beam splitter.

Figure 4:
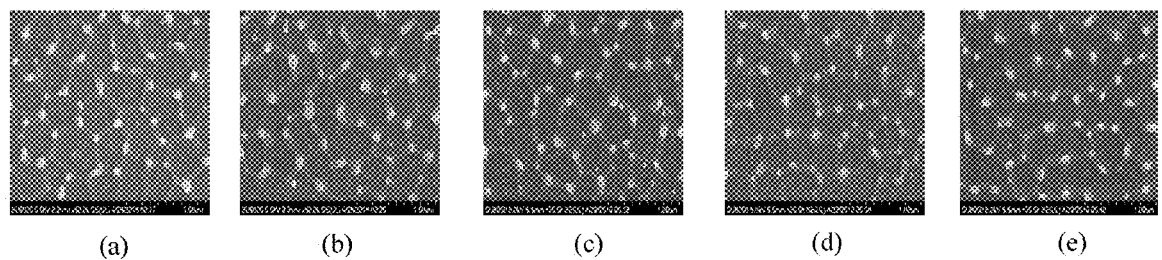
FIG. 4 are scanning electron micrographs of polysilicon grains obtained under different melting energy conditions provided by the embodiments of the present disclosure.

In addition, in the embodiments of the present disclosure, a grain size of the polysilicon is tested under different energy conditions; and the test is performed with the energy 600 mj for just melting the polysilicon surface as a reference and with the energies being sequentially increased by 10 mj. For example, FIG. 4 are scanning electron micrographs of the polysilicon grain obtained under different melting energy conditions provided by the embodiments of the disclosure. In FIG. 4, (a), (b), (c), (d) and (e) are respectively scanning electron micrographs obtained under a condition that no melting process is performed, a condition that the melting process with energy of 600 mj is performed, a condition that the melting process with energy of 610 mj is performed, a condition that the melting process with energy of 620 mj is performed, and a condition that the melting process with energy of 630 mj is performed; and as can be seen from FIG. 4, the grain size of the polysilicon grain obtained under the above-described five conditions is substantially unchanged. Therefore, the processing of the protrusions on the polysilicon surface does not substantially affect the size of the crystal grain of the polysilicon, and thus will not bring any adverse effect to the polysilicon.

For example, the grain size of the polysilicon grain obtained under the above-described conditions of different melting energies is shown in Table One below.

TABLE ONE

| | Energy | | | | |
|---|---|---|---|---|---|
| | No processing | 600 mj | 610 mj | 620 mj | 630 mj |
| Maximum grain size | 510 | 420 | 450 | 420 | 510 |
| Minimum grain size | 240 | 240 | 240 | 270 | 300 |
| Average grain size | 337 | 340 | 342 | 343 | 360 |
| Standard deviation | 4.86% | 3.79% | 4.61% | 3.46% | 4.13% |

As can be seen from Table One, the melting performed on the protrusions formed on the polysilicon surface does not affect the size of the crystal grain of the polysilicon. Therefore, in the case that the melting is performed on the protrusions formed on the polysilicon surface to reduce the non-uniformity of the polysilicon surface, there is no adverse effect on the polysilicon.

After the protrusions on the polysilicon surface are melted, roughness of the polysilicon surface is examined by an atomic force microscope. For example, the test is performed with the energy 600 mj for just melting the polysilicon surface as a reference and with the energies being sequentially increased by 10 mj, and results are shown in Table Two below.

TABLE TWO

| | Energy/height of protrusion | | | | |
|---|---|---|---|---|---|
| | No processing | 600 mj | 610 mj | 620 mj | 630 mj |
| Average value | 9.95 | 5.21 | 5.46 | 5.54 | 5.27 |
| Arithmetic mean | 12.2 | 6.92 | 6.8 | 6.91 | 6.68 |
| Amplitude | 39.5 | 24.4 | 23.7 | 24.2 | 23.5 |

As can be seen from Table Two, the average value, the arithmetic mean and the amplitude obtained from all polysilicon slightly melting tests are almost half of those tested under the condition with no processing, which indicates that slightly melting performed on the polysilicon surface has a very significant effect on reducing the roughness of the polysilicon surface.

For example, as shown in FIG. 3, in the laser annealing apparatus provided in the embodiments of the disclosure, the optical system 220 further includes a light uniformization component 222, a focus mirror 223 and a reflection mirror 224.

For example, the laser beam 211 emitted from the excimer laser has a rectangular cross section, the size of the rectangular cross section of the laser beam 211 is 14.5 mm×35 mm; and after beam-expanding, beam-smoothing and edge-processing performed by the light uniformization component 222, the size of the rectangular cross section of the laser beam 211 becomes 2 mm×750 mm. After the uniformization process performed by the light uniformization component 222, uniformity of light intensity of the laser beam 211 is improved, with its non-uniformity ≤5%.

As shown in FIG. 3, the light uniformization component 222 includes a short axis light uniformization element 2221, a collection element 2222, a long axis light uniformization element 2223, a long axis expansion element 2224 and a short axis contraction element 2225.

For example, the short axis light uniformization element 2221 makes a short axis of the laser beam more uniform. For example, the short axis light uniformization element 2221 acts on the two laser beams. FIG. 3 shows two short axis light uniformization elements 2221 provided adjacent to each other; however, the embodiments of the present disclosure are not limited thereto, and one or more short axis light uniformization elements 2221 may be provided.

For example, the collection element 2222 combines the two laser beams into one laser beam, the energy after the two laser beams are combined is doubled. For example, one laser beam has the energy of 1000 mj, and the total energy after the two laser beams are combined is 2000 mj.

For example, the long axis light uniformization element 2223 makes a long axis of the combined laser beam more uniform. FIG. 3 shows two long axis light uniformization elements 2223 provided adjacent to each other; however, the embodiments of the present disclosure are not limited thereto, and one or more long axis light uniformization elements 2223 may be provided.

For example, the long axis expansion element 2224 makes the long axis of the combined laser beam longer, and at a same time, makes the long axis of the combined laser beam more uniform.

For example, the short axis contraction element 2225 makes the short axis of the combined laser beam shorter, and at a same time, makes the short axis of the combined laser beam more uniform.

For example, in the propagation direction of the laser beam, the short axis light uniformization element 2221, the collection element 2222, the long axis light uniformization element 2223, the long axis expansion element 2224, and the short axis contraction element 2225 are sequentially arranged in this order.

For example, in the embodiments of the present disclosure, the optical system further includes the focus mirror 223, and as shown in FIG. 3, the focus mirror 223 includes a long axis focus mirror 2231, a short axis focus mirror 2232, and an auxiliary focus mirror 2233. The long axis focus mirror 2231 performs focus of the long axis to make energy more concentrated. For example, in the propagation direction of the laser beam, the long axis focus mirror 2231 is located between the long axis light uniformization element 2223 and the long axis expansion element 2224. The short axis focus mirror 2232 and the auxiliary focus mirror 2233 function together, and perform focus to make shorter the short axis of the laser beam which has the size of 2 mm×750 mm after passing through the light uniformization component 222, so that a length of the short axis is reduced to 0.4 mm. For example, in the propagation direction of the laser beam, the short axis focus mirror 2232 is located between the short axis contraction element 2225 and the beam splitter 221. For example, in the propagation direction of the laser beam, the auxiliary focus mirror 2233 is located behind the beam splitter 221 and the reflection mirror 224.

For example, as shown in FIG. 3, the reflection mirror 224 includes a first reflection mirror 2241, a second reflection mirror 2242 and a third reflection mirror 2243; and the reflection mirror 224 is used for changing the direction of the laser beam. For example, the first beam 212 is reflected by the first reflection mirror 2241 and the second reflection mirror 2242 and then is guided to the annealing chamber 230; and the second beam 213 is reflected by the third reflection mirror 2243 and then is guided to the annealing chamber 230. For example, the first beam 212 is reflected by the first reflection mirror 2241 and the second reflection mirror 2242, passes through the auxiliary focus mirror 2233, and then is guided to the annealing chamber 230. For example, the second beam 213 is reflected by the third reflection mirror 2243, passes through the auxiliary focus mirror 2233, and then is guided to the annealing chamber 230.

For example, as shown in FIG. 3, the laser annealing apparatus further comprises a carrier 231 located within the annealing chamber 230 (e.g., the carrier 231 is provided at a bottom of the annealing chamber 230), and the carrier 231 is used for carrying the substrate. The amorphous silicon thin film is formed on an upper surface of the substrate, and the amorphous silicon thin film is subjected to the laser annealing by the laser annealing apparatus so as to form the polysilicon thin film.

For example, the carrier 231 carries the substrate, and the carrier 231 is driven by an driver so that the carrier 231 moves in the annealing chamber 230 to bring the substrate to move with respect to the first beam and the second beam; the first beam firstly irradiates the amorphous silicon thin film to covert the amorphous silicon thin film to the polysilicon thin film, and then the polysilicon thin film is moved so that the second beam irradiates the polysilicon thin film to reduce non-uniformity of the surface of the polysilicon thin film, so as to reduce the height of the protrusions on the surface of the polysilicon thin film. In another example, the polysilicon thin film is not moved, while the first beam and the second beam are moved.

For example, a side of the annealing chamber 230 close to the optical system 220 is provided with a first slit 2301 and a second slit 2302, which respectively allow the first beam 212 and the second beam 213 to pass through, and widths of the first slit 2301 and the second slit 2302 are both 1 mm to 3 mm, for example, the widths of the first slit 2301 and the second slit 2302 are both 2 mm. For example, the first slit 2301 and the second slit 2302 are capable of being opened and closed so that the second beam 213 does not enter into the annealing chamber 230 during the first beam 212 irradiates the amorphous silicon thin film to covert the amorphous silicon thin film to the polysilicon thin film, and the first beam 212 does not enter into the annealing chamber 230 during the second beam 213 irradiates the polysilicon thin film to reduce non-uniformity of the surface of the polysilicon thin film.

For example, the annealing chamber 230 is filled with a protective gas 232, so as to isolate the amorphous silicon thin film to be annealed from oxygen, for example, the protective gas 232 is nitrogen, argon, and the like.

Figure 5:
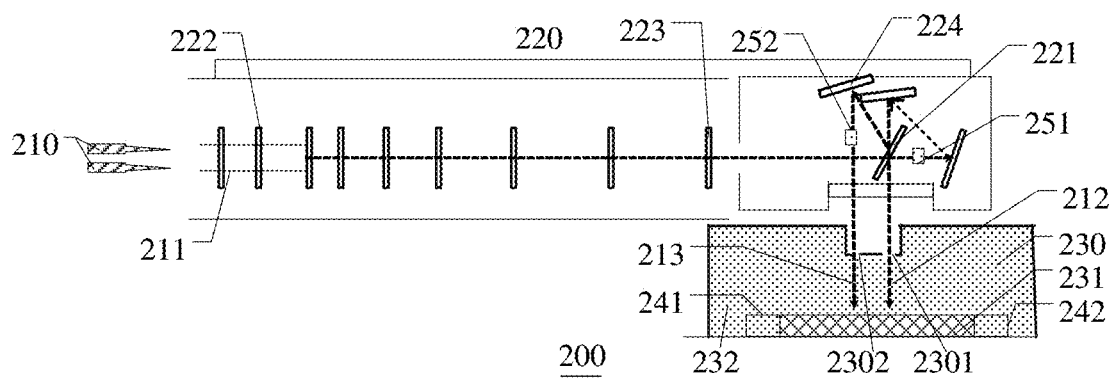
FIG. 5 is a structural schematic view of another laser annealing apparatus provided by the embodiments of the present disclosure.

For example, FIG. 5 is a structural schematic view of another laser annealing apparatus provided by the embodiments of the present disclosure. The laser annealing apparatus 200 further comprises a first detector 241 and a second detector 242 respectively provided on both ends of the carrier 231; and the first detector 241 and the second detector 242 respectively detect energy densities of the first beam 212 and the second beam 213. In the case that the first detector 241 and the second detector 242 detect the energy densities of the first beam 212 and the second beam 213 to find out that the energy densities of the first beam 212 and the second beam 213 do not reach preset values, then it is necessary to adjust the beam splitter 221 and the reflection mirror 224. For example, the preset value corresponding to the first detector 241 is the optimum energy density (OED) for converting amorphous silicon to polysilicon, i.e., 400 $mj/cm^2$; and the preset value corresponding to the second detector 242 is the optimum energy density (OED) for just melting the polysilicon surface, i.e., 200 $mj/cm^2$.

For example, as shown in FIG. 5, the laser annealing apparatus further comprises: a first attenuator 251 and a second attenuator 252. In actual operation, energy densities of the first beam and the second beam before they reach the annealing chamber may be greater than the preset energy densities, and in this case, the energy densities of the first beam and the second beam are attenuated respectively by the first attenuator 251 and the second attenuator 252, to allow the energy densities thereof to reach the preset values.

Figure 6:
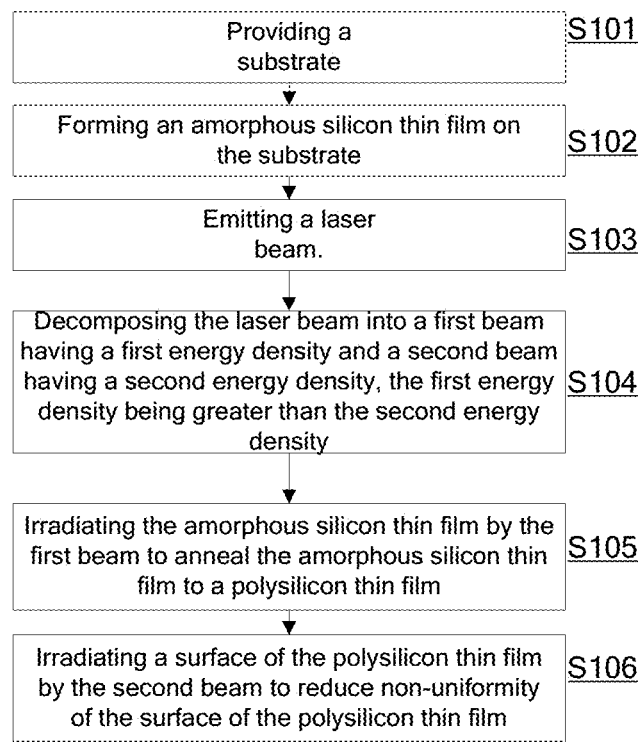
FIG. 6 is a flow chart of a fabrication method of a polysilicon thin film provided by the embodiments of the present disclosure.
Figure 7A:
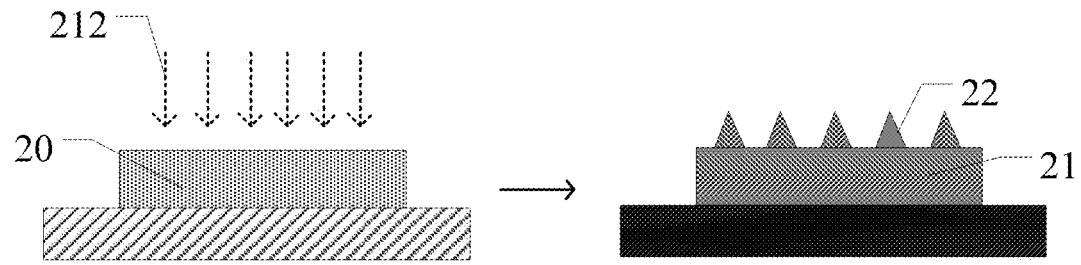
FIG. 7*a* to FIG. 7*b* are process views of the fabrication method of the polysilicon thin film provided by the embodiments of the present disclosure.
Figure 7B:
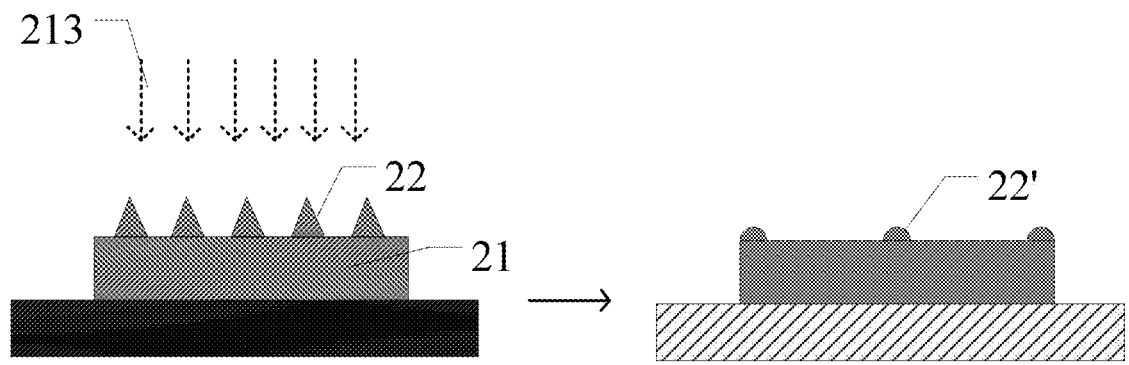

The embodiments of the present disclosure further provide a fabrication method of a polysilicon thin film, for example, FIG. 6 is a flow chart of the fabrication method of the polysilicon thin film provided by the embodiments of the present disclosure; and FIG. 7a to FIG. 7b are process views of the fabrication method of the polysilicon thin film provided by the embodiments of the present disclosure. The fabrication method of the polysilicon thin film comprises the following steps.

S101: providing the substrate.

For example, the substrate is firstly cleaned, and then the substrate is placed on the carrier provided on the bottom of the annealing chamber. For example, the substrate includes a glass substrate, a quartz substrate, or a substrate made of other suitable material.

S102: depositing the amorphous silicon thin film on the substrate.

For example, before the amorphous silicon thin film is deposited on the substrate, a buffer layer is deposited on the substrate so as to improve an interface characteristic between the substrate and the amorphous silicon thin film. For example, the buffer layer of 100 nm to 350 nm is deposited by using a plasma enhanced chemical vapor deposition (PECVD) method. For example, the buffer layer is a $SiN_x/SiO_2$ double-layer structure, SiNx having a thickness of 50 nm to 150 nm, $SiO_2$ having a thickness of 100 nm to 350 nm. For example, the buffer layer is a single-layer structure of $SiN_x$ or a single-layer structure of $SiO_2$, $SiN_x$ having a thickness of 50 nm to 150 nm, and $SiO_2$ having a thickness of 100 nm to 350 nm. In the subsequent process of forming the polysilicon thin film, silicon oxide ($SiO_2$) is provided more adjacent to the amorphous silicon thin film than silicon nitride ($SiN_x$), which is more conducive to formation of polysilicon with a better crystalline phase, and silicon nitride is more effective in blocking contaminants from the substrate. Thus, in the embodiments of the present disclosure, the buffer layer of the double-layer structure is formed so that an upper layer of the buffer layer is silicon oxide and a lower layer of the buffer layer is silicon nitride. A purpose of forming the buffer layer on the substrate is to prevent ions in the substrate from diffusing into the polysilicon thin film to form a defective center and further increase leakage current; besides, the buffer layer with a suitable thickness also improves quality of the polysilicon surface, reduces heat conduction, and slows down a cooling rate of polysilicon heated by the laser beam, which is conducive to formation of polysilicon with a larger crystal grain. For example, a thickness of the buffer layer is 150 nm to 500 nm.

For example, the amorphous silicon thin film is deposited on the buffer layer by using a chemical vapor deposition (CVD) method such as the plasma enhanced chemical vapor deposition method, and a thickness of the deposited amorphous silicon thin film is 30 nm to 60 nm. For example, the deposited amorphous silicon thin film has a thickness of 50 nm.

S103: emitting a laser beam.

For example, in the embodiments of the present disclosure, annealing is performed on the amorphous silicon thin film with the laser annealing apparatus, and the laser annealing apparatus emits the laser beam by the excimer laser.

For example, the excimer laser includes the inert gas excimer laser, the inert gas halide excimer laser, the mercury halide excimer laser, the inert gas oxide excimer laser, and the polyatomic excimer laser.

For example, the inert gas excimer laser includes the $Ar_2$ excimer laser, the $Kr_2$ excimer laser, the $Xe_2$ excimer laser, and the like; the inert gas halide excimer laser includes the ArF excimer laser, the ArCl excimer laser, the KrF excimer laser, the KrCl excimer laser, the XeF excimer laser, the XeCl excimer laser, and the like; the mercury halide excimer laser includes the HgCl excimer laser, the HgBr excimer laser, the HgI excimer laser, and the like; the inert gas oxide excimer laser includes the ArO excimer laser, the KrO excimer laser, the XeO excimer laser, and the like; and the polyatomic excimer laser includes the $Kr_2F$ excimer laser, the $Xe_2F$ excimer laser, and the like.

For example, in the process of laser annealing, a laser pulse has a frequency of 500 Hz, an overlap rate is of 92% to 97%, and the laser beam has the wavelength in the range of 200 nm to 400 nm, for example, the wavelength of the laser beam generated by the excimer laser generator is 308 nm. For example, the energy density of the laser beam is 350 mJ/cm$^2$ to 500 mJ/cm$^2$. It should be noted that, the overlap rate refers to a percentage of an overlapping area of two adjacent laser-irradiated regions to a total area of the two laser-irradiated regions.

For example, the cross section of the laser beam is rectangular and its length is greater than its width, and a width direction of the laser beam is parallel to a first direction. For example, the cross section of the laser beam has a length of 750 mm, a width of 0.4 mm, and a total area of 300 mm$^2$. For example, the maximum energy of one laser beam is 1000 mj; in the embodiments of the disclosure, two laser beams are combined and the total energy of the two laser beams is 2000 mj.

S104: decomposing the laser beam into the first beam having the first energy density and the second beam having the second energy density, the first energy density being greater than the second energy density.

Figure 8:
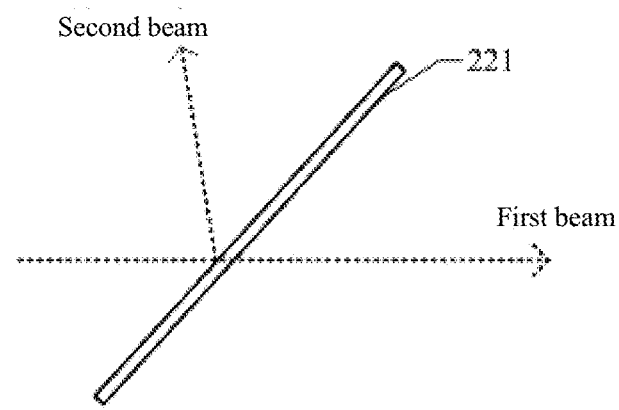
FIG. 8 is a schematic view of a beam splitter decomposing a laser beam provided by the embodiments of the present disclosure.

For example, FIG. 8 is a schematic view of the beam splitter decomposing the laser beam provided by the embodiments of the disclosure. The first beam directly passes through the beam splitter, and then continues propagating along its original propagation direction; and the second beam is totally reflected by the beam splitter and then changes its propagation direction. For example, the energy density of the first beam is 400 mj/cm$^2$, and the energy density of the second beam is 200 mj/cm$^2$. Under the condition that the cross section of the combined laser beam has the length of 750 mm, the width of 0.4 mm and the total area of 300 mm$^2$, the total energy of the combined laser beam is 2000 mj, the energy of the first beam is 1200 mj and the energy of the second beam is 800 mj. The total energy required to convert amorphous silicon to polysilicon is 1200 mj; based on the polysilicon surface melting test, it is found that the energy for just melting the polysilicon surface is 600 mj; and thus, the first beam and the second beam obtained by decomposition of the beam splitter are capable of respectively implementing converting amorphous silicon to polysilicon and reducing the height of the protrusions of the polysilicon surface. In this way, the energy of the laser beam are fully utilized under the premise that working time of the laser annealing apparatus is ensured not to be increased, so as to improve working efficiency and save process steps.

For example, the first detector 241 and the second detector 242 provided on the laser annealing apparatus respectively detect the energy densities of the first beam and the second beam. In the case that the first detector 241 and the second detector 242 detect the energy densities of the first beam and the second beam to find out that the energy densities do not reach the preset values, then it is necessary to adjust the beam splitter 221 and the reflection mirror 224.

For example, in the actual operation process, the energy densities of the first beam and the second beam before they reach the annealing chamber are greater than the preset energy densities, the energy densities of the first beam and the second beam are attenuated respectively by the first attenuator 251 and the second attenuator 252, to allow the energy densities thereof to reach the preset values.

S105: irradiating the amorphous silicon thin film by the first beam to anneal the amorphous silicon thin film to the polysilicon thin film.

For example, before the annealing process is performed on the amorphous silicon thin film, a high-temperature process is performed on the amorphous silicon thin film, a temperature of the high-temperature process is 400° C. to 500° C., and a time of the high-temperature process is 0.5 hours to 3 hours. It should be noted that, the high-temperature process reduces a hydrogen content within the amorphous silicon film, and prevents occurrence of hydrogen explosion during subsequent laser annealing.

For example, FIG. 7a is a process view of performing laser annealing on the amorphous silicon thin film, to convert the amorphous silicon thin film to the polysilicon thin film. A mechanism of converting the amorphous silicon thin film to the polysilicon thin film includes that: amorphous silicon (a-Si) absorbs energy under radiation of the first beam 212 with high energy, the temperature of the surface of the amorphous silicon thin film 20 increases rapidly, further the amorphous silicon thin film 20 is melted and converted to a liquid state, a region where the amorphous silicon thin film is melted falls deep into the inside of the amorphous silicon thin film at an extremely rapid speed, and after the first beam 212 irradiates the amorphous silicon thin film for a period of time, the amorphous silicon thin film forms a melted layer with a certain depth; after the irradiation of the first beam 212 is ended, the melted layer begins to be cooled at a speed of 108 K/s to 1010 K/s, at this time, an interface between the solid phase and the liquid phase is returned to the surface at a relatively slow speed of (1 m/s to 2 m/s), and the cooled amorphous silicon thin film 20 is converted to the polysilicon (p-Si) thin film 21. In a process of conversion from amorphous silicon to polysilicon, the crystal grain grows transversely from a crystal nucleus; since density of solid silicon is relatively small (about 2.32 g/cm$^3$), an excess volume is squeezed to a region which has not yet been cured when amorphous silicon is melted, to form first protrusions 22.

S106: irradiating the polysilicon thin film surface by the second beam to reduce non-uniformity of its surface.

The carrier in the laser annealing apparatus brings the substrate to move toward the second beam, for example, FIG. 7b is a process view that the second beam 213 irradiating the first protrusions 22 of the crystallized polysilicon thin film, the first protrusions 22 are melt so that non-uniformity of the crystallized polysilicon surface is reduced, the height of the first protrusions 22 is reduced and even some of the first protrusions 22 are eliminated. In another example, the polysilicon thin film is fixed, while the first beam and second beam are moved.

For example, the case where the thickness of the amorphous silicon thin film is 50 nm is provided as an example, the height of the second protrusions 22' are obtained by photographing the finally-formed polysilicon thin film with the atomic force microscope (AFM). For example, an average height of the second protrusions 22' is less than 6 nm, and the average height of the second protrusions 22' is reduced by half with respect to the height of the first protrusions 22. The reduction of the height of the first protrusions 22 increases mobility of electrons and holes, reduces risks of puncture of the gate insulation layer, and reduces a phenomenon of short circuit between the gate electrode layer and the semiconductor layer.

For example, the carrier is moved in the first direction (i.e., the polysilicon thin film is moved in the first direction). For example, the laser beam has the rectangular cross section and its length is greater than its width, the width direction of the laser beam is parallel to the first direction, and the direction from the first beam to the second beam is the first direction.

The embodiments of the present disclosure further provide a fabrication method of a thin film transistor, and the method comprises: preparing the polysilicon thin film by using the fabrication method according to the above embodiments of the present disclosure; patterning the polysilicon thin film to form a polysilicon pattern serving as an active layer of the thin film transistor.

Figure 9:
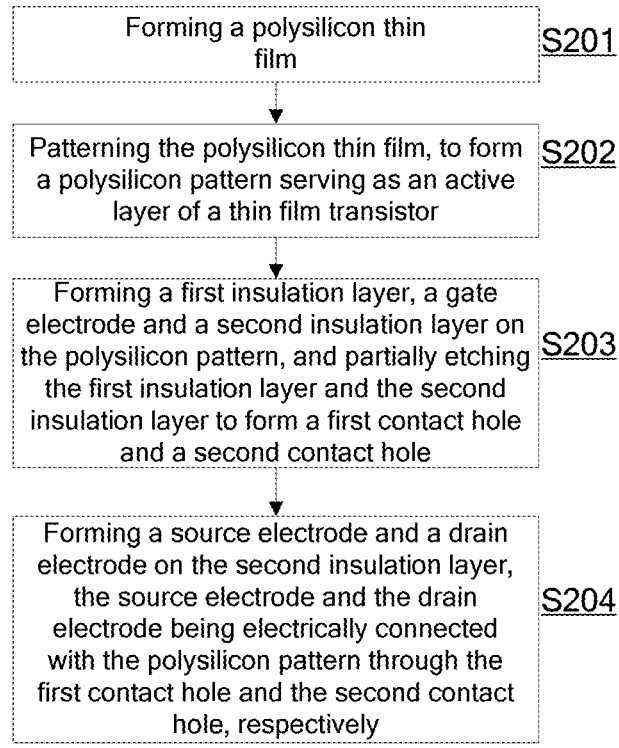
FIG. 9 is a flow chart of a fabrication method of a thin film transistor provided by the embodiments of the present disclosure.

For example, FIG. 9 is a flow chart of the fabrication method of the thin film transistor provided by the embodiments of the disclosure, and the fabrication method of the thin film transistor comprises steps of:

S201: preparing the polysilicon thin film.

For example, the polysilicon thin film is prepared by using the fabrication method according to the above embodiments of the present disclosure; for example, the height of the protrusions on the surface of the polysilicon thin film is less than 25% of the total thickness of the polysilicon thin film.

S202: patterning the polysilicon thin film, to form the polysilicon pattern serving as the active layer of the thin film transistor.

For example, the patterning process includes coating photoresist on the formed polysilicon thin film, and performing exposure, development, etching, peeling the photoresist and other process to form the polysilicon (active layer) pattern. For example, the photoresist is coated by spin coating, knife coating or roller coating.

S203: forming a first insulation layer, a gate electrode and a second insulation layer on the polysilicon pattern, and partially etching the first insulation layer and the second insulation layer to form a first contact hole and a second contact hole.

For example, the first insulation layer is a gate insulation layer; a gate insulation thin film is deposited on the polysilicon pattern, a photoresist (not shown) is coated on the gate insulation thin film, and exposure, development, etching, peeling the photoresist, and other process are performed to form a pattern of the gate insulation layer. For example, a material for forming the gate insulation thin film includes silicon nitride (SiNx), silicon oxide (SiOx), alumina ($Al_2O_3$), aluminum nitride (AlN), or other suitable materials.

For example, a gate metal thin film is deposited on the first insulation layer, a photoresist is coated on the gate metal thin film, and exposure, development, etching, peeling the photoresist and other process are performed to form a pattern of the gate electrode.

For example, a material for forming the gate electrode is a combination of copper and other metals, e.g., copper/molybdenum (Cu/Mo), copper/titanium (Cu/Ti), copper/molybdenum titanium alloy (Cu/MoTi), copper/molybdenum tungsten alloy (Cu/MoW), copper/molybdenum niobium alloy (Cu/MoNb), etc. For example, the material for forming the gate electrode is a chromium-based metal or a combination of chromium and other metals, e.g., chromium/molybdenum (Cr/Mo), chromium/titanium (Cr/Ti), chromium/molybdenum titanium alloy (Cr/MoTi), and the like.

For example, a second insulation thin film is deposited on the gate electrode, a photoresist (not shown) is coated on the second insulation thin film, and exposure, development, etching, peeling the photoresist and other process are performed to form a pattern of the second insulation layer. For example, a material for forming the second insulation layer includes silicon nitride (SiNx), silicon oxide (SiOx), aluminum oxide ($Al_2O_3$), aluminum nitride (AlN), or other suitable materials.

In the processes of patterning the first insulation thin film and the second insulation thin film, the first insulation layer and the second insulation layer are partially etched to form the first contact hole and the second contact hole.

S204: forming a source electrode and a drain electrode on the second insulation layer, the source electrode and the drain electrode being electrically connected with the polysilicon pattern through the first contact hole and the second contact hole, respectively.

For example, a material for forming the source electrode and the drain electrode is copper, copper alloy, aluminum, aluminum alloy, molybdenum, molybdenum alloy or other suitable material.

The thin film transistor prepared by the method is the thin film transistor of top gate type structure, the active layer in the thin film transistor is the low temperature polysilicon thin film, the crystal grain of the polysilicon thin film has a larger size with uniform grain size distribution, and the polysilicon thin film has a very low surface roughness, which can solve problems of larger leakage current, and non-uniformity of mobility and threshold voltage of the thin film transistor.

Figure 10:
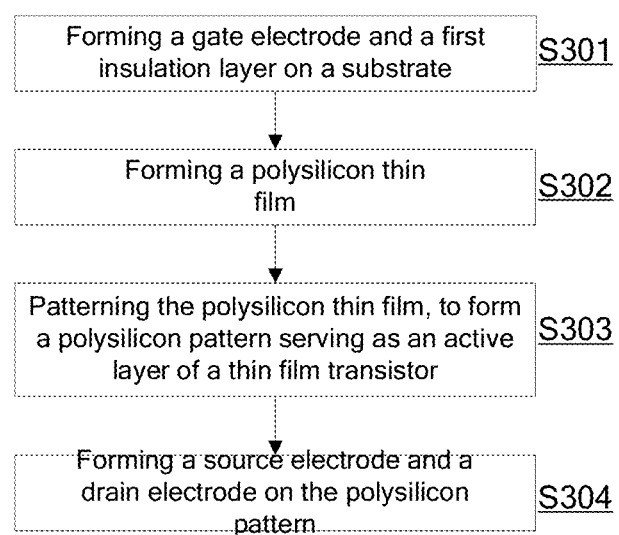
FIG. 10 is a flow chart of another fabrication method of the thin film transistor provided by the embodiments of the present disclosure.

For example, FIG. 10 is a flow chart of another fabrication method of the thin film transistor provided by the embodiments of the present disclosure, and the fabrication method of the thin film transistor comprises steps of:

S301: forming the gate electrode and the first insulation layer on the substrate;

S302: preparing the polysilicon thin film;

S303: patterning the polysilicon thin film, to form the polysilicon pattern serving as the active layer of the thin film transistor;

S304: forming the source electrode and the drain electrode on the polysilicon pattern.

For example, for processes of forming the gate electrode, the first insulation layer, the polysilicon thin film, the source electrode and the drain electrode as well as for materials for forming them, relevant description of the fabrication method shown in FIG. 9 may be referred to, which will not be repeated here.

The thin film transistor prepared by the method is the thin film transistor of bottom gate type structure, the active layer in the thin film transistor is the low temperature polysilicon thin film, the crystal grain of the polysilicon thin film has a larger size with uniform grain size distribution, and the polysilicon thin film has a very low surface roughness, which can solve problems of larger leakage current, and non-uniformity of mobility and threshold voltage of the thin film transistor.

The embodiments of the present disclosure provide the laser annealing apparatus, the fabrication method of the polysilicon thin film, and the fabrication method of the thin film transistor. The laser annealing apparatus comprises the laser generator, the optical system and the annealing chamber, the laser generator is configured to emit the laser beam, the laser beam is guided to the annealing chamber via the optical system, the optical system includes the beam splitter, the beam splitter decomposes the laser beam into the first beam and the second beam so that the energy density of the first beam is greater than the energy density of the second beam, and the first beam and the second beam are guided into the annealing chamber for laser annealing. The amorphous silicon thin film is annealed with the laser annealing apparatus according to the embodiments of the present disclosure. The embodiments of the disclosure have advantageous effects as follows: the first beam firstly irradiates the amorphous silicon thin film to anneal it to the polysilicon thin film, and then the formed polysilicon thin film is moved so that the second beam irradiates the polysilicon thin film surface to reduce non-uniformity of the surface thereof, which improves the mobility of the electrons and the holes, solves problems of larger leakage current, and non-uniformity of mobility and threshold voltage of the thin film transistor, reduces the risks of puncture of the gate insulation layer, and further reduces the phenomenon of short circuit between the gate electrode layer and the semiconductor layer.

There are some points to be illustrated:

(1) Drawings of the embodiments of the present disclosure only refer to structures related with the embodiments of the present disclosure, and general designs may be referred to for other structures.

(2) In order to make it clear, in the drawings for illustrating the embodiment of the present disclosure, a thickness of a layer or a region is magnified or reduced, that is, those drawings are not drawn according to actual proportion. It should be understood that, when elements such as a layer, a film, a region or a substrate and the like are called to be "above" or "below" another element, the element may be directly located "on" or "beneath" the other element, or there may be an intermediate element.

(3) In a case of no conflict, the embodiments of the present disclosure and the features of the embodiments may be combined with each other to form new embodiments.

The foregoing embodiments are only specific embodiments of the disclosure, but the protection scope of the disclosure is not limited by this, and the protection scope of the present disclosure is determined by a protection scope of claims.

The invention claimed is:

1. A laser annealing apparatus, comprising: a laser generator, an optical system and an annealing chamber, wherein,
the laser generator is configured to emit a laser beam, the laser beam is guided to the annealing chamber after passing the optical system;
the optical system includes a beam splitter, the beam splitter decomposes the laser beam into a first beam and a second beam, an energy density of the first beam is greater than an energy density of the second beam, and the first beam and the second beam are guided into the annealing chamber for laser annealing;
a side of the annealing chamber is provided with a first slit and a second slit, the first beam enters into the annealing chamber through the first slit, the second beam enters into the annealing chamber through the second slit, the first slit and the second slit are configured that the first slit is opened while the second slit is closed, and the second slit is opened while the first slit is closed;
the optical system further includes a light uniformization component, a focus mirror and a reflection mirror, and in a propagation direction of the laser beam, the light uniformization component and the focus mirror are provided in front of the beam splitter, and the reflection mirror is provided after the beam splitter;
the light uniformization component includes a short axis light uniformization element, a collection element, a long axis light uniformization element, a long axis expansion element and a short axis contraction element; and
in the propagation direction of the laser beam, the short axis light uniformization element, the collection element, the long axis light uniformization element, the long axis expansion element, and the short axis contraction element are sequentially arranged in this order;
the focus mirror includes a long axis focus mirror, a short axis focus mirror, and an auxiliary focus mirror;
in the propagation direction of the laser beam, the long axis focus mirror is located between the long axis light uniformization element and the long axis expansion element;
in the propagation direction of the laser beam, the short axis focus mirror is located between the short axis contraction element and the beam splitter; and
in the propagation direction of the laser beam, the auxiliary focus mirror is located behind the beam splitter and the reflection mirror.

2. The laser annealing apparatus according to claim 1, wherein, an energy of the first beam is greater than an energy of the second beam.

3. The laser annealing apparatus according to claim 1, wherein, the laser generator is an excimer laser.

4. The laser annealing apparatus according to claim 3, wherein, the excimer laser includes an inert gas excimer laser, an inert gas halide excimer laser, a mercury halide excimer laser, an inert gas oxide excimer laser and a polyatomic excimer laser.

5. The laser annealing apparatus according to claim 1, wherein,
the reflection mirror includes a first reflection mirror, a second reflection mirror and a third reflection mirror;
the first beam is reflected by the first reflection mirror and the second reflection mirror and then is guided to the annealing chamber; and
the second beam is reflected by the third reflection mirror and then is guided to the annealing chamber.

6. The laser annealing apparatus according to claim 1, comprising at least two laser generators respectively emitting a first laser beam and a second laser beam, the first laser beam and the second laser beam being combined to obtain the laser beam.

7. The laser annealing apparatus according to claim 6, wherein, an energy of the first laser beam and an energy of the second laser beam are both 1000 mj, an energy of the first beam is 1200 mj, and an energy of the second beam is 800 mj.

8. The laser annealing apparatus according to claim 1, further comprising a carrier provided in the annealing chamber for carrying a substrate, and a first detector and a second detector respectively provided on both ends of the carrier;
wherein, the first detector and the second detector respectively detect the energy density of the first beam and the energy density of the second beam.

9. The laser annealing apparatus according to claim 1, wherein, the annealing chamber is filled with a protective gas.

10. The laser annealing apparatus according to claim 1, further comprising a first attenuator and a second attenuator, wherein, the first attenuator and the second attenuator respectively attenuate the energy density of the first beam and the energy density of the second beam.

11. A laser annealing apparatus, comprising: a laser generator, an optical system and an annealing chamber, wherein,
the laser generator is configured to emit a laser beam, the laser beam is guided to the annealing chamber after passing the optical system;
the optical system includes a beam splitter, the beam splitter decomposes the laser beam into a first beam and a second beam, an energy of the first beam is greater than an energy of the second beam, and the first beam and the second beam are guided into the annealing chamber for laser annealing; and
a side of the annealing chamber is provided with a first slit and a second slit, the first beam enters into the annealing chamber through the first slit, the second beam enters into the annealing chamber through the second slit, the first slit and the second slit are configured that the first slit is opened while the second slit is closed, and the second slit is opened while the first slit is closed, the optical system further includes a light uniformization component, a focus mirror and a reflection mirror, and in a propagation direction of the laser beam, the light uniformization component and the focus mirror are provided in front of the beam splitter, and the reflection mirror is provided after the beam splitter;

the light uniformization component includes a short axis light uniformization element, a collection element, a long axis light uniformization element, a long axis expansion element and a short axis contraction element; and in the propagation direction of the laser beam, the short axis light uniformization element, the collection element, the long axis light uniformization element, the long axis expansion element, and the short axis contraction element are sequentially arranged in this order;

the focus mirror includes a long axis focus mirror, a short axis focus mirror, and an auxiliary focus mirror;

in the propagation direction of the laser beam, the long axis focus mirror is located between the long axis light uniformization element and the long axis expansion element;

in the propagation direction of the laser beam, the short axis focus mirror is located between the short axis contraction element and the beam splitter; and in the propagation direction of the laser beam, the auxiliary focus mirror is located behind the beam splitter and the reflection mirror.

* * * * *